United States Patent [19]

Matsunaga et al.

[11] Patent Number: 5,375,652

[45] Date of Patent: Dec. 27, 1994

[54] HEAT RADIATING APPARATUS FOR SEMICONDUCTOR DEVICE

[75] Inventors: Katsuki Matsunaga; Yasushi Kojima; Naoya Yamazaki; Kiyoshi Yoshida; Yoshinori Hoshino, all of Kawasaki, Japan

[73] Assignee: Fujitsu Limited, Kawasaki, Japan

[21] Appl. No.: 103,683

[22] Filed: Aug. 10, 1993

[30] Foreign Application Priority Data

Dec. 25, 1992 [JP] Japan .................. 4-346943

[51] Int. Cl.⁵ .......................... F28F 7/00
[52] U.S. Cl. ...................... 165/80.3; 165/185; 257/718; 257/719; 361/690; 361/703
[58] Field of Search ............... 165/80.3, 185; 174/16.3; 257/713, 718, 719, 722; 361/383, 386, 690, 702, 703, 704, 709, 710, 697

[56] References Cited

U.S. PATENT DOCUMENTS

| | | | |
|---|---|---|---|
| 4,345,267 | 8/1982 | Corman et al. | 257/722 X |
| 4,575,038 | 3/1986 | Moore | 248/505 |
| 4,607,685 | 8/1986 | Mitchell, Jr. | 165/80.3 |
| 4,716,494 | 12/1987 | Bright et al. | 361/386 |
| 4,745,456 | 5/1988 | Clemens | 361/386 X |

FOREIGN PATENT DOCUMENTS

| | | | |
|---|---|---|---|
| 3434792 | 4/1986 | Germany | 257/718 |
| 126659 | 6/1987 | Japan | 257/718 |
| 87049 | 4/1991 | Japan | 257/718 |

Primary Examiner—John Rivell
Assistant Examiner—L. R. Leo
Attorney, Agent, or Firm—Armstrong, Westerman, Hattori, McLeland & Naughton

[57] ABSTRACT

A heat radiating apparatus for a semiconductor device, in which said semiconductor device mounted on a circuit board is cooled by a radiator. The radiator is provided with a stepped portion, and fixing spring hardware having slit grooves is provided with a notch engaging with the stepped portion, so that the end of radiator is brought into contact with the outer surface of the semiconductor device when the stepped portion of the radiator engages with the notch portion of the fixing spring hardware. The stepped portion of the radiator is constituted of two stages, and the notch of the fixing spring hardware is provided with two notch portions engaging with the two-stage stepped portions of the radiator, respectively, so that the larger-diameter portion of the two-stage stepped portions of the radiator engages with the farthermost portion of the notch. Further, a male threaded portion is installed near the end of the radiator so that the male threaded portion of the radiator is threadedly fixed to the farthermost portion of the notch of the fixing spring hardware.

9 Claims, 8 Drawing Sheets

HEAT RADIATING APPARATUS FOR SEMICONDUCTOR DEVICE

BACKGROUND OF THE INVENTION

1. Field of the Invention

The present invention relates to a heat radiating apparatus for a semiconductor device and, more particularly, a heat radiating apparatus for a semiconductor device which cools a semiconductor device mounted on a circuit board by means of a radiator.

2. Description of the Related Art

Recently, semiconductor integrated circuits have been more highly integrated and their operation has become faster as the function of electronic devices has become higher and greater density mounting has been realized. As a result, the power requirement has increased and the heating value of a semiconductor device has also increased. Therefore, a heat radiating apparatus is needed which efficiently radiates heat from the surface of a semiconductor device.

There are two conventional types of heat radiating apparatus for a semiconductor device in which an external radiator is brought into contact with the semiconductor device. For one type, a radiator having a plurality of heat radiating fins is fixed to the stud section with a heat conductive adhesive on the top surface of the semiconductor device mounted on a circuit board. For the other type, a radiator having a similar construction is fixed to the top surface of the semiconductor device by means of fixing hardware. For example, the fixing hardware, divided into two pieces, is inserted between the heat radiating fins of the radiator, and the end surface of the stud section is pushed onto the top surface of the semiconductor device, so that the fixing hardware is fixed to the circuit board. The fixing is performed by screwing or hooking.

The heat radiators described above, however, have the following problems. In the case of the former type, an adhesive is present between the semiconductor device and the radiator. Even though the adhesive is heat conductive, the heat conductivity is low as compared with the case where the semiconductor device is in direct contact with the radiator. Therefore, the heat radiation efficiency is lowered. Moreover, since the heat expansion efficiency differs between the radiator and the heat conductive adhesive, thermal stress is produced at high temperatures, thereby a stress is given to the top surface of the semiconductor device. In addition, the temperature cycle results in the deterioration or breakage of the adhesive, thereby resulting in the radiator coming off the semiconductor device, In the case of the latter type, there is a possibility that the radiator can be installed in such a manner as to slightly float or be tilted with respect to the top surface of the semiconductor device. In this case, the contact area is significantly decreased, and the heat conductivity is greatly lowered because the heat conduction from the semiconductor device to the radiator is carried out by the contact only. In fixing the radiator to the semiconductor device, a pressure higher than necessary may be applied to the semiconductor device from the radiator. In this case, there is a possibility of damage to the semiconductor device.

SUMMARY OF THE INVENTION

An object of the present invention is to provide a heat radiating apparatus for a semiconductor device which assures reliable heat conduction from the semiconductor device to a radiator without giving stress to the top surface of the semiconductor device mounted on a circuit board, while preventing the radiator from coming off the semiconductor device.

To achieve the above object, the present invention provides a heat radiating apparatus for a semiconductor device, in which said semiconductor device mounted on a circuit board is cooled by a radiator. This heat radiating apparatus for a semiconductor device comprises a radiator having a stepped portion near an end thereof and having heat radiating fins; and a radiator contacting means which has a notch portion engaging with the stepped portion of the radiator and an elastic means and is fixed to the circuit board. The elastic means brings the radiator into contact with the outer surface of the semiconductor device when the stepped portion of the radiator engages with the notch portion.

Preferably, the radiator contacting means is formed of an elastic plate material, and the elastic means is formed by arranged slots disposed in the plate material.

Preferably, the stepped portion of the radiator is constituted of two stages, and the notch of the radiator contacting means is provided with two notch portions engaging with the two-stage stepped portions of the radiator, respectively.

Further, to achieve the above object, according to another embodiment of the invention the present invention provides a heat radiating apparatus for a semiconductor device, in which the semiconductor device mounted on a circuit board is cooled by a radiator, comprising: a radiator having a male threaded portion near the end thereof and having heat radiating fins; and a radiator contacting means which has a notch portion engaging with the male threaded portion of the radiator and is fixed to a circuit board.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The embodiments of the present invention dill be described with reference to the drawings.

Figure 1A:
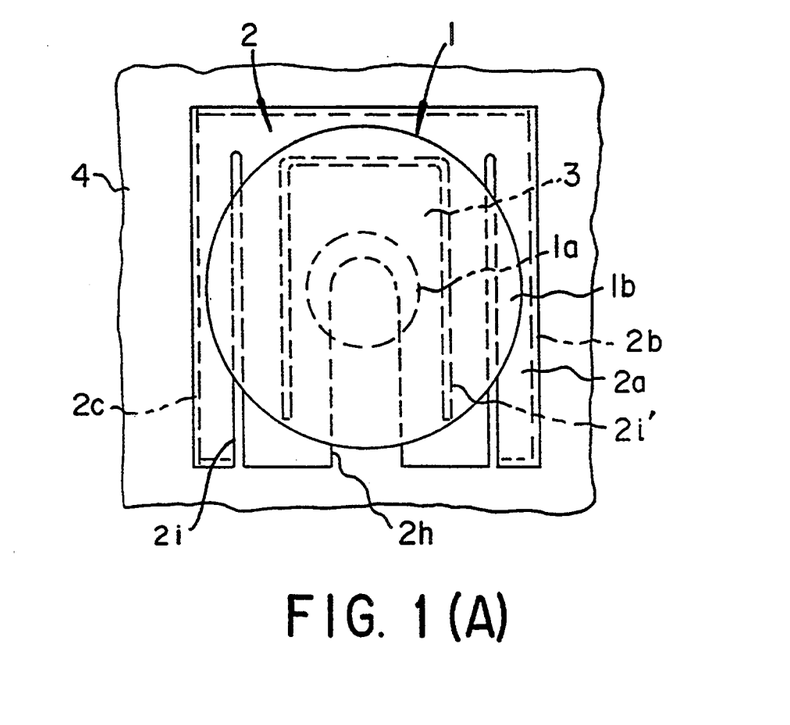
FIG. 1(A) is a plan view of a first embodiment of a heat radiating apparatus for a semiconductor device.
Figure 1B:
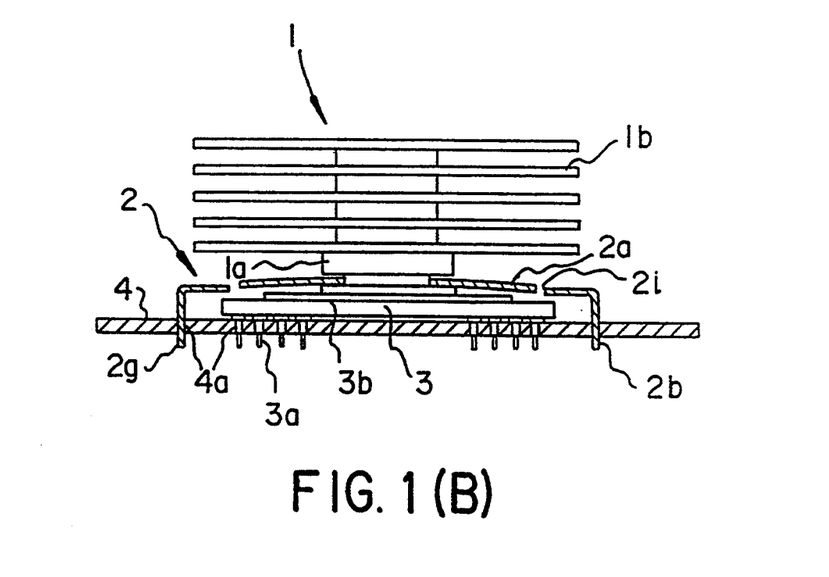
FIG. 1(B) is a side sectional view of a first embodiment of a heat radiating apparatus for a semiconductor device.

FIG. 1 shows a first embodiment of a heat radiating apparatus for a semiconductor device. FIG. 1(A) is a plan view, and FIG. 1(B) is a side sectional view. The heat radiating apparatus comprises a radiator 1 and fixing spring hardware 2. The semiconductor device 3, which is a PGA-type LSI, is mounted on a circuit board 4. The semiconductor device 3 is provided with a plurality of leads 3a and a heat sink 3b. The circuit board 4 is provided with a plurality of through holes 4a. The detailed construction of the radiator 1 and fixing spring hardware 2 will be described with reference to FIGS. 2 and 3 in addition to FIG. 1.

Figure 2:
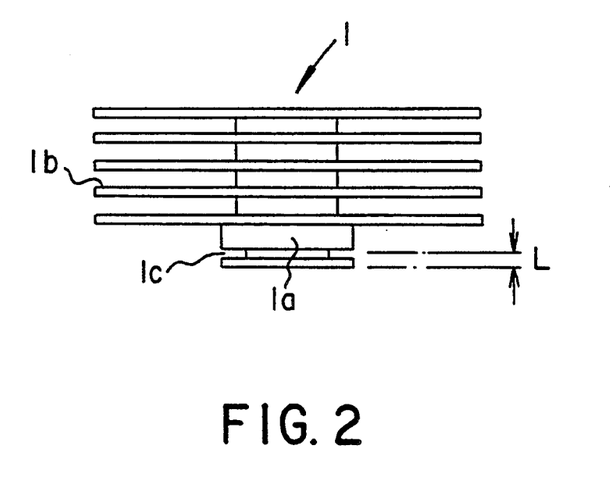
FIG. 2 is a side view of a radiator.

FIG. 2 is a side view of the radiator 1. The radiator 1 is made of a highly heat conductive metal, such as aluminum, and has a cylindrical stud section 1a and a plurality of disk-shaped heat radiating fins 1b. A circumferential groove 1c is provided about the circumference of the stud section 1a near an end thereof.

Figure 3A:
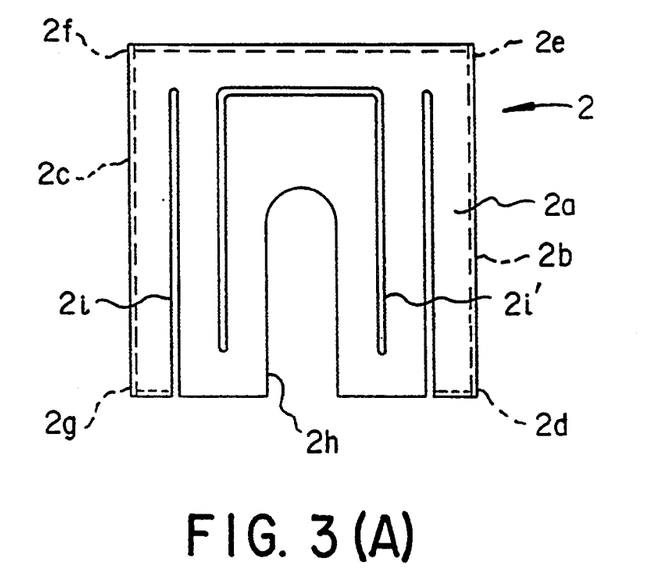
FIG. 3(A) is a plan view of fixing spring hardware.
Figure 3B:
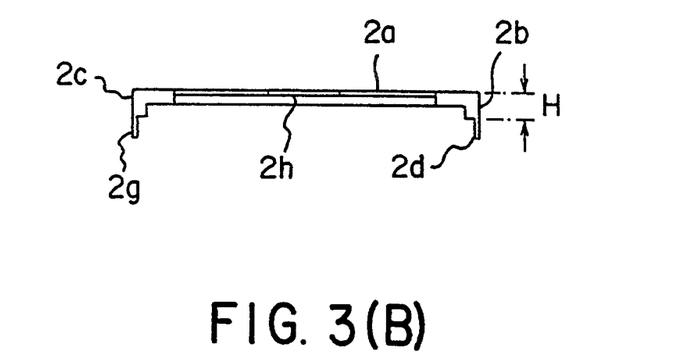
FIG. 3(B) is a side view of fixing spring hardware.

FIG. 3 shows the fixing spring hardware 2. FIG. 3(A) is a plan view thereof, and FIG. 3(B) is a side view. The fixing spring hardware 2 has a spring property, and is fabricated from heat conductive, thin metal plate. It comprises an intermediate piece 2a occupying the flat portion and bent pieces 2b and 2c. The bent pieces 2b and 2c are bent so that the intermediate piece 2a overlies the semiconductor device 3 mounted on the circuit board 4 in a generally inverted U shape. At four corners of the bent pieces 2b and 2c, attaching legs 2d to 2g are integrally installed which are inserted into the through holes 4a in the circuit board 4. At the center of the intermediate piece 2a, a transversely extending, open ended notch 2h is disposed which engages with the circumferential groove 1c of the radiator 1. The notch 2h comprises an opening portion with a width equal to the diameter of the circumferential groove 1c of the radiator 1, a semi-circular innermost portion with a diameter equal to the diameter of the circumferential groove 1c of the radiator 1, and a straight intermediate portion connecting the opening to the innermost portion. An arrangement of slots formed by a first set of slots, indicated as 2i, which are open-ended and disposed on opposite sides of the notch 2h and a second set of slots 2i' arranged in an inverted U-shape with legs which are parallel to, and disposed intermediate the slots 2i and the straight intermediate portion of the notch cooperate to provide a continuous, yieldable metal structure effective to enhance the recovery of the fixing spring hardware by producing a pair of parallel legs that are independent and successively deflectable about pivot axes at the ends of the respective legs 2h so that the intermediate piece 2a can be deflected vertically (in the up and down direction in FIG. 3(A)), thereby facilitating spring displacement. The split grooves 2i and 2i' are formed symmetrically with the notch 2h being a center of symmetry as shown in FIG. 3(A). The height H of the bent pieces 2b, 2c and the length L (see FIG. 2) from the end surface of the stud section 1a of the radiator 1 to the circumferential groove 1c are determined considering the shape of slots 2i and 2i' so that the radiator 1 is pushed against the top surface of the semiconductor device 3 with a proper resilient pushing force when the radiator 1 and the fixing spring hardware 2 are mounted on the circuit board 4, as shown in FIG. 1.

Next, the assembly procedure of the heat radiating apparatus will be described with reference to FIG. 4.

Figure 4:
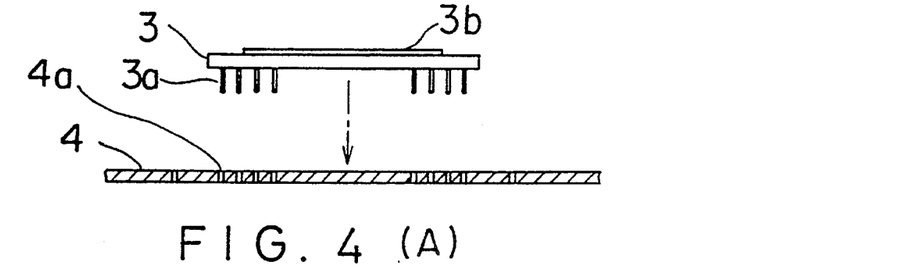
FIG. 4(A) is a side sectional view of a heat radiating apparatus showing the first process of assembly procedure.
FIG. 4(B) is a side sectional view of a heat radiating apparatus showing the second process of assembly procedure.
FIG. 4(C) is a side sectional view of a heat radiating apparatus showing the third process of assembly procedure.
FIG. 4(D) is a side sectional view of a heat radiating apparatus showing the fourth process of assembly procedure.

FIG. 4 is a side sectional view of a heat radiating apparatus showing the assembly procedure. The assembly is performed in the order of FIG. 4(A) to FIG. 4(D). First, in FIG. 4(A), the semiconductor device 3 is mounted on the circuit board 4. That is, the leads 3a of the semiconductor device 3 are inserted into the through holes 4a in the circuit board 4 to temporarily fix the semiconductor device 3.

Next, in FIG. 4(B), the fixing spring hardware 2 is mounted to the circuit board 4 so as to overlie the semiconductor device 3. That is, the attaching legs 2d to 2g of the fixing spring hardware 2 are inserted into the through holes 4a of the circuit board 4.

In FIG. 4(C), the eads 3a of the semiconductor device 3 and the attaching egs 2d to 2g of the fixing spring hardware 2 are bonded to the circuit board 4 by soldering and fixed.

Finally, in FIG. 4(D), the circumferential groove 1c of the radiator 1 is aligned with the notch 2h of the fixing spring hardware 2, and the radiator 1 is slid to the central portion of the fixing spring hardware 2 from the side. At this time, the end surface of the stud section 1a of the radiator 1 is in tight contact with the heat sink 3b on the top surface of the semiconductor device due to the resiliency of the fixing spring hardware 2 effected by the action of the cooperation between the split slots 2i and 2i', thereby reliable heat conduction from the semiconductor device 3 to the radiator 1 being ensured. Further, heat is radiated from the fixing spring hardware 2 since the fixing spring hardware 2 is also formed of a material with high heat conductivity. The end surface of the stud section 1a of the radiator can be accurately Located at the position where heat is conducted most easily with respect to the heat sink 3b on the top surface of the semiconductor device 3 since design can be easily made in advance such that the innermost portion of the notch 2h of the fixing spring hardware 2 is at a suitable position with respect to the heat sink 3b.

Although the circumferential groove 1c is disposed near the end surface of the stud section 1a of the radiator 1 in the above-described embodiment, any stepped portion engaging with the notch 2h of the fixing spring hardware 2 may be substituted for the circumferential groove 1c. For example, a straight groove extending in the direction normal to the axial direction of the stud section or simple irregularities may be used.

Next, a second embodiment will be described with reference to FIGS. 5 and 6.

Figure 5:
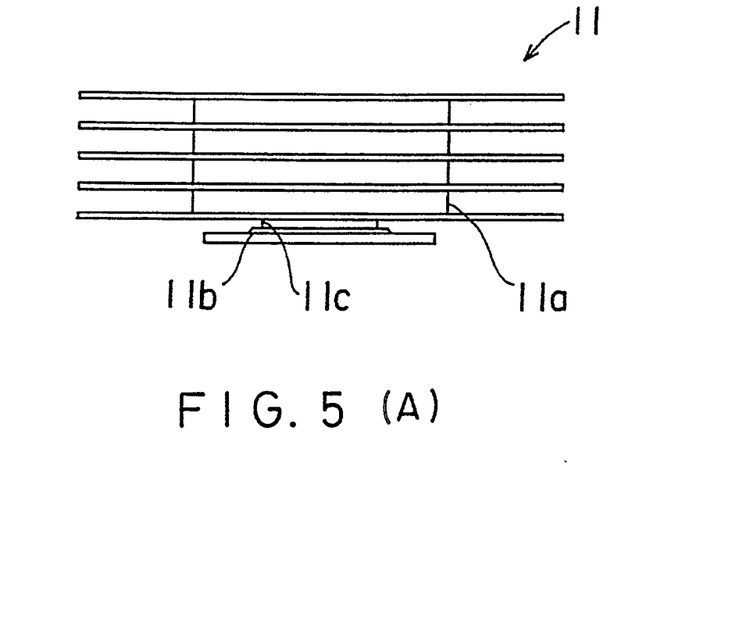
FIG. 5(A) is a side view of a radiator of a second embodiment.
FIG. 5(B) is a bottom view of a radiator of a second embodiment.

FIG. 5 shows a radiator in accordance with the second embodiment of the heat radiating apparatus for a semiconductor device. FIG. 5(A) is a side view of the radiator, and FIG. 5(B) is a bottom view of the radiator viewed from the lower side. The radiator 11 in accordance with the second embodiment has nearly the same shape as that of the radiator 1 of the first embodiment, except for the circumferential groove. In the second embodiment, two stages of circumferential grooves 11b and 11c are disposed near the end surface of the stud section 11a. The diameter V of the circumferential groove 11b is greater than the diameter W of the circumferential groove 11c.

Figure 6:
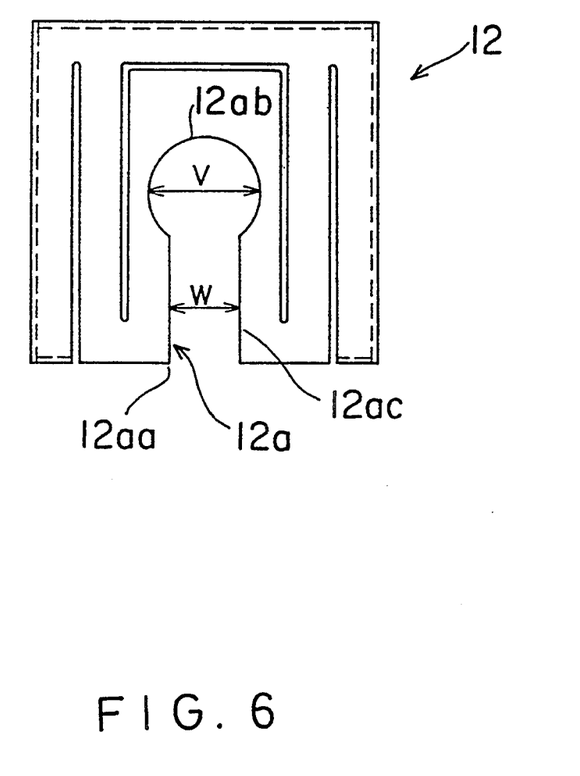
FIG. 6 is a plan view of fixing spring hardware of a second embodiment.

FIG. 6 is a plan view of fixing spring hardware of the second embodiment. The fixing spring hardware 12 in accordance with the second embodiment has nearly the same shape as that of the fixing spring hardware 2 of the first embodiment, except for the notch. The notch 12a of the second embodiment comprises an opening 12aa with a width W which is the same as the diameter W of the circumferential groove 11c of the radiator 11, a circular innermost portion 12ab with a diameter V which is the same as the diameter V of the circumferential groove 11b of the radiator 11, and a straight intermediate portion 12ac with a width W which connects the opening 12aa to the innermost portion 12ab.

In assembling the heat radiating apparatus of the second embodiment, therefore, the circumferential groove 11c of the radiator 11 is engaged with the opening 12aa and the intermediate portion 12ac of the notch 12a of the fixing spring hardware 12, and the radiator 11 is slid toward the innermost portion 12ab of the notch 12a of the fixing spring hardware 12 from the side. When the stud section 11a of the radiator 11 reaches the innermost portion 12ab of the fixing spring hardware 12, the circumferential groove 11b of the radiator 11 engages with the innermost portion 12ab of the fixing spring hardware 12 since the fixing spring hardware 12 always tends to move toward the circuit board side as with the case of the first embodiment. Thus, the stud section 11a of the radiator 11 is fixed to the innermost portion 12ab, thereby the radiator is prevented from coming off the fixing spring hardware 12 due to vibration, etc.

Next, a third embodiment will be described with reference to FIGS. 7 and 8.

Figure 7:
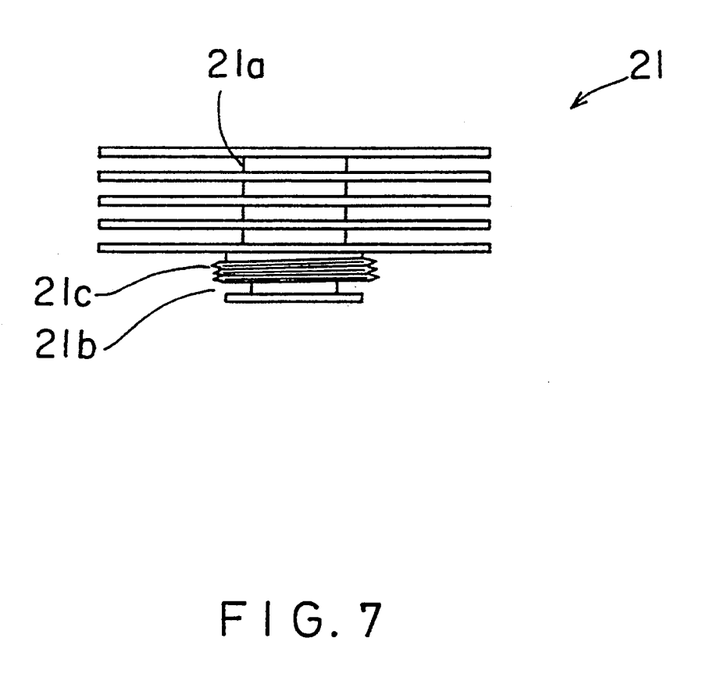
FIG. 7 is a side view of a radiator of a third embodiment.

FIG. 7 is a side view of a radiator of the third embodiment of the heat radiating apparatus for a semiconductor device. The radiator 21 in accordance with the third embodiment has nearly the same shape as that of the radiator 1 of the first embodiment, except for the circumferential groove. The radiator of the third embodiment has a threaded portion 21c in addition to the circumferential groove 21b near the end surface of the stud section 21a. The diameter W of the circumferential groove 21b is smaller than the thread groove diameter V of the threaded portion 21c.

Figure 8:
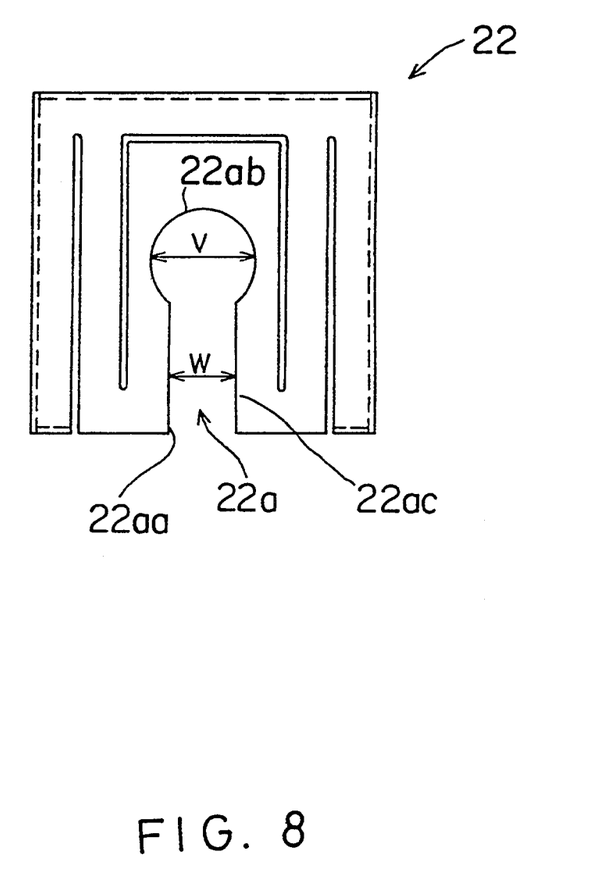
FIG. 8 is a plan view of fixing spring hardware of a third embodiment.

FIG. 8 is a plan view of the fixing spring hardware of the third embodiment. The fixing spring hardware 22 in accordance with the third embodiment has nearly the same shape as that of the fixing spring hardware 2 of the first embodiment, except for the notch. The notch 22a of the third embodiment comprises an opening 22aa with a width W which is the same as the diameter W of the circumferential groove 21b of the radiator 21, an innermost portion 22ab with a diameter V which is the same as the thread groove diameter V of the threaded portion 21c of the radiator 21, and a straight intermediate portion 22ac with a width W which connects the opening 22aa to the innermost portion 22ab.

In assembling the heat radiating apparatus of the third embodiment, therefore, the circumferential groove 21b of the radiator 21 is engaged with the opening 22aa and the intermediate portion 22ac of the notch 22a of the fixing spring hardware 22, and the radiator 21 is slid toward the innermost portion 22ab of the notch 22a of the fixing spring hardware 22 from the side. When the stud section 21a of the radiator 21 reaches the innermost portion 22ab of the fixing spring hardware 22, the radiator 21 is turned with the axis of the stud section being the center so that the threaded portion 21c of the radiator 21 is threadedly mounted to the innermost portion 22ab of the fixing spring hardware 22. By adjusting the amount of rotation of the radiator 21, the spring displacement of the fixing spring hardware 22 is regulated, thereby the pushing force of the end surface of the radiator 21 against the top surface of the semiconductor device can be adjusted to an appropriate value. In the above-described first and second embodiments, the pushing force of the end surface of the stud section against the top surface of the semiconductor device is determined unitarily, while in the third embodiment, the pushing force can be adjusted, which prevents an excess pushing force from being applied to the semiconductor device. Also, the stud section 21a of the radiator 21 is fixed to the innermost portion 22ab of the fixing spring hardware 22, which prevents the radiator 21 from coming off the fixing spring hardware 22 due to vibration etc.

In the above embodiments, the semiconductor device is described as a PGA type LSI. However, a QFP type LSI may be used as the semiconductor device.

Although, in the above embodiments, the fixing spring hardware is formed of a heat conductive material, the material is not necessarily heat conductive. It may be a resin, or the like, if it is springy. However, a material having higher heat conductivity is preferable.

In the above embodiments, the springiness is enhanced by disposing slots in the fixing spring hardware, so that the radiator is easily brought into contact with the semiconductor device. However, the slots are not always necessary. Since the fixing spring hardware is springy, the radiator can be brought into contact with the semiconductor device.

Also, in the above embodiment, the fixing spring hardware is installed to the circuit board in such a manner as to overlie the semiconductor device. For the semiconductor device in which a heat sink is installed on the circuit board side, however, holes are made on the circuit board side near the heat sink so as to install the fixing spring hardware on the circuit board side opposite to the semiconductor device.

Further, silicon compound or other heat conductive filler may be interposed between the end surface of the stud section of the radiator and the heat sink of the semiconductor device to provide better contact between them.

As described above, the present invention is characterized in that the radiator is provided with a stepped portion, and the radiator-contacting means having an elastic means is provided with a notch portion engaging with the stepped portion, so that when the stepped portion of the radiator is engaged with the notch portion of the radiator contacting means, the end of the radiator is in contact with the outer surface of the semiconductor device. Thus, reliable heat conduction from the semiconductor device to the radiator is ensured without stress being applied to the top surface of the semiconductor device mounted on the circuit board and while preventing the radiator from coming off the semiconductor device.

The radiator contacting means is formed of an elastic plate material, and the elastic means is defined by slit grooves disposed in the plate material. This brings the end of the radiator into contact with the outer surface of the semiconductor device more reliably, Also, the stepped portion of the radiator is constituted of two stages, and the notch of the radiator-contacting means may be provided with two notch portions engaging with the two-stage portions having a different diameter of the radiator, respectively, so that the larger diameter portion of the two-stage stepped portions of the radiator engages with the innermost portion of the notch of the radiator contacting means. This prevents the radiator from coming off the radiator contacting means due to vibration etc.

Further, a male threaded portion may be provided near the end of the radiator. When the radiator is slid to the central portion of the radiator contacting means, the male threaded portion of the radiator is threadedly mounted to the farthermost portion of the notch of the radiator contacting means. By threadedly mounting the male threaded portion, the spring displacement of the fixing spring hardware is regulated, thereby the pushing force of the end surface of the radiator against the top surface of the semiconductor device can be adjusted to an appropriate value.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention in the appended claims and their equivalents.

What is claimed is:

1. A heat radiating apparatus for a semiconductor device, in which said semiconductor device mounted on a circuit board is cooled by a radiator, comprising:
    a radiator having heat radiating fins and a stepped portion adjacent an end thereof; and
    a radiator contacting means fixed to said circuit board and having a notch portion engaging with the stepped portion of said radiator and an elastic means urging said radiator into contact with the outer surface of said semiconductor device when the stepped portion of said radiator engages with said notch portion, said radiator contacting means being formed on a resilient plate material and said elastic means being defined by a plurality of slots disposed in said plate material substantially symmetrically about said notch portion, said slots being arranged to form on each side of said notch portion a pair of parallel legs independently and successively deflectable about pivot axes at the ends of the respective legs to define a continuous, yieldable metal structure containing said notch portion.

2. A heat radiating apparatus for a semiconductor device according to claim 1 wherein said radiator contacting means is formed of an elastic, heat conductive metal plate material.

3. A heat radiating apparatus for a semiconductor device according to claim 1 wherein said radiator comprises a stud section having a groove near the end thereof and a plurality of heat radiating fins installed on said stud section.

4. A heat radiating apparatus for a semiconductor device according to claim 1 wherein said radiator contacting means is of a inverted U sectional shape, has portions on opposite sides of said notch connecting to said circuit board, and is fixed to said circuit board in such a manner as to overlie said semiconductor device.

5. A heat radiating apparatus for a semiconductor device in which said semiconductor device mounted on a circuit board is cooled by a radiator, comprising:
    a radiator having heat radiating fins and a stepped portion adjacent an end thereof; and
    a radiator contacting means fixed to said circuit board and having a notch portion engaging with the stepped portion of said radiator and an elastic means, said elastic means urging said radiator into contact with the outer surface of said semiconductor device when the stepped portion of said radiator engages with said notch portion, wherein the stepped portion of said radiator is constituted of two stages, and the notch portion of said radiator contacting means is provided with two notch portions engaging with the two-stage stepped portions of said radiator, respectively.

6. A heat radiating apparatus for a semiconductor device in which said semiconductor device mounted on a circuit board is cooled by a radiator, comprising:
    a radiator having heat radiating fins and a stepped portion adjacent an end thereof; and
    a radiator contacting means fixed to said circuit board and having a notch portion engaging with the stepped portion of said radiator and an elastic means, said elastic means urging said radiator into contact with the outer surface of said semiconductor device when the stepped portion of said radiator engages with said notch portion, wherein said radiator comprises a stud section having two-stage circumferential grooves near the end thereof and a plurality of heat radiating fins installed on said stud section, and the notch portion of said radiator contacting means comprises a first notch portion which is straight and engages with the smaller-diameter circumferential groove of the two-stage circumferential grooves of said radiator and a second notch portion which is disposed at the end of said first notch portion and engages with the larger-diameter circumferential groove of the two-stage circumferential grooves of said radiator.

7. A heat radiating apparatus for a semiconductor device, in which said semiconductor device mounted on a circuit board is cooled by a radiator, comprising:
    a radiator having a male threaded portion near the end thereof and having heat radiating fins; and
    a radiator contacting means which has a notch portion engaging with said male threaded portion of said radiator and is fixed to a circuit board.

8. A heat radiating apparatus for a semiconductor device according to claim 7 wherein said radiator contacting means has an elastic means for bringing said radiator into contact with the outer surface of said semiconductor device when said male threaded portion of said radiator engages with said notch portion.

9. A heat radiating apparatus for a semiconductor device according to claim 7 wherein said male threaded portion of said radiator is threadedly mounted in the notch portion of said radiator contacting means and is adjusted so that the end of said radiator is in close contact with the outer surface of said semiconductor device.

\* \* \* \* \*